(12) United States Patent
Lee et al.

(10) Patent No.: US 10,607,831 B2
(45) Date of Patent: Mar. 31, 2020

(54) THIOUREA ORGANIC COMPOUND FOR GALLIUM ARSENIDE BASED OPTOELECTRONICS SURFACE PASSIVATION

(71) Applicant: International Business Machines Corporation, Armonk, NY (US)

(72) Inventors: Yun Seog Lee, White Plains, NY (US); Ning Li, White Plains, NY (US); Qinglong Li, Yorktown Heights, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/586,356

(22) Filed: May 4, 2017

(65) Prior Publication Data

US 2018/0323123 A1    Nov. 8, 2018

(51) Int. Cl.
| | |
|---|---|
| *H01L 21/00* | (2006.01) |
| *H01L 21/02* | (2006.01) |
| *H01L 23/31* | (2006.01) |
| *H01L 23/29* | (2006.01) |
| *H01L 29/20* | (2006.01) |

(52) U.S. Cl.
CPC .. *H01L 21/02052* (2013.01); *H01L 21/02112* (2013.01); *H01L 21/02227* (2013.01); *H01L 23/291* (2013.01); *H01L 23/3171* (2013.01); *H01L 23/3185* (2013.01); *H01L 23/3192* (2013.01); *H01L 29/20* (2013.01)

(58) Field of Classification Search
None
See application file for complete search history.

(56) References Cited

U.S. PATENT DOCUMENTS

| | | | |
|---|---|---|---|
| 6,380,097 B1 | 4/2002 | Dauplaise et al. | |
| 9,558,931 B2 | 1/2017 | Tang et al. | |
| 2014/0027884 A1* | 1/2014 | Tang | H01L 23/293 257/632 |
| 2014/0048897 A1* | 2/2014 | Qian | H01L 27/1463 257/431 |
| 2017/0229384 A1* | 8/2017 | Harikai | H01L 21/30655 |

FOREIGN PATENT DOCUMENTS

WO    WO-2017076659 A1 *    5/2017    ......... H01L 23/293

* cited by examiner

*Primary Examiner* — Reema Patel
(74) *Attorney, Agent, or Firm* — Fleit Intellectual Property Law; Thomas S. Grzesik

(57) ABSTRACT

A semiconductor structure and a method for fabricating the same. The semiconductor structure includes a gallium arsenide substrate, a thiourea-based passivation layer in contact with at least a top surface of the gallium arsenide substrate, and a capping layer in contact with the thiourea-based passivation layer. The method includes passivating a gallium arsenide substrate utilizing thiourea to form a passivation layer in contact with at least a top surface of the gallium arsenide substrate. The method further includes forming a capping layer in contact with at least a top surface of the passivation layer, and annealing the capping layer and the passivation layer.

6 Claims, 4 Drawing Sheets

THIOUREA ORGANIC COMPOUND FOR GALLIUM ARSENIDE BASED OPTOELECTRONICS SURFACE PASSIVATION

BACKGROUND OF THE INVENTION

The present invention generally relates to the field of semiconductor devices, and more particularly relates to passivation semiconductor devices.

In semiconductor technology, an elemental semiconductor material such as, for example, Silicon (Si) or Germanium (Ge), is typically used as a substrate in which one or more semiconductor devices including, but not limited to, optoelectronic devices (e.g., light emitting diodes, lasers, and photovoltaic devices), FETs and capacitors, are formed. Of the various elemental semiconductor materials, Si is the elemental semiconductor of choice due to process and performance benefits that are achieved using such an elemental semiconductor material. However, a need for alternative semiconductor materials has been driven by the growth of markets that require semiconductor device performance beyond that which Si semiconductors can provide. One such alternative semiconductor material is Gallium Arsenide (GaAs), which is a III-V compound semiconductor material.

SUMMARY OF THE INVENTION

In one embodiment, a method for fabricating a semiconductor structure is provided. The method comprises passivating a gallium arsenide substrate utilizing thiourea to form a passivation layer in contact with at least a top surface of the gallium arsenide substrate. A capping layer is formed in contact with at least a top surface of the passivation layer. The capping layer and passivation layer are annealed.

In another embodiment, a semiconductor structure is provided. The semiconductor structure comprises a substrate a gallium arsenide substrate and a thiourea-based passivation layer. The thiourea-based passivation layer in is contact with at least a top surface of the gallium arsenide substrate. A capping layer is in contact with the thiourea-based passivation layer.

In yet another embodiment, an integrated circuit is disclosed. The integrated circuit comprises at least one semiconductor structure. The semiconductor structure comprises a substrate a gallium arsenide substrate and a thiourea-based passivation layer. The thiourea-based passivation layer in is contact with at least a top surface of the gallium arsenide substrate. A capping layer is in contact with the thiourea-based passivation layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As noted above, a need for alternative semiconductor materials has been driven by the growth of markets that require semiconductor device performance beyond that which Si semiconductors can provide. GaAs has greater electron mobility than Si so the majority carriers move faster than in Si. There are also some attributes of a GaAs semiconductor material that reduce parasitic capacitance and signal loses.

One major disadvantage of a GaAs semiconductor material (as well as the other III-V compound semiconductors) is the lack of a natural oxide. This feature hinders the performance of optoelectronic devices such as light emitting diodes, lasers, and photovoltaic devices. For example, the electron-hole recombination through the defects will reduce the light emission for light emitting diodes and lasers, and reduce the light absorption efficiency for photovoltaic devices. In addition, the lack of a natural oxide hinders the development of standard metal oxide semiconductor (MOS) devices that require the ability to form a surface dielectric. Moreover, when a dielectric material having a dielectric constant that is greater than silicon dioxide (k greater than 4.0) is deposited on a GaAs semiconductor material that has an unpassivated surface, the interface between the high k dielectric and the GaAs semiconductor material is typically poor, resulting in a high interface state density (on the order of about $10^{13}$ $cm^{-2}$ $eV^{-1}$ or greater).

As will be discussed in greater detail below, one or more embodiments of the present invention overcome these problems by passivating the GaAs semiconductor material utilizing a thiourea compound. The thiourea-passivated surface reduces the defect density of the GaAs semiconductor material and increases device performance characteristics.

Figure 1:
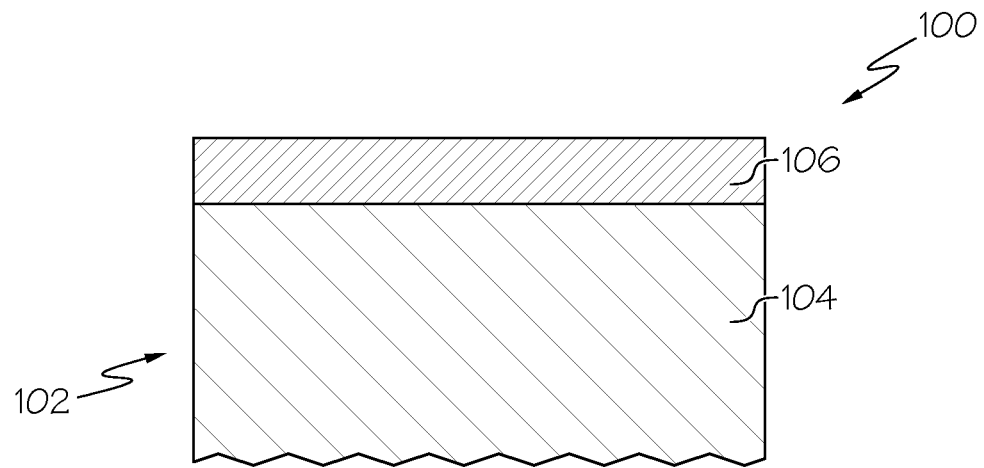
FIG. 1 is a cross-sectional view of an initial semiconductor structure comprising a substrate according to one embodiment of the present invention.

Referring now to the drawings in which like numerals represent the same of similar elements, FIGS. 1-8 illustrate various processes for fabricating a semiconductor structure comprising a thiourea-passivated surface. FIG. 1 illustrates an initial semiconductor structure comprising a substrate 102 including a semiconductor material 104. In one embodiment, the semiconductor material 104 is GaAs and may be an intrinsic GaAs wafer. As shown, the semiconductor material 104 has a region 106 that includes native oxide(s) such as atomic Ga or As species. The region 106 of native oxides and possibly other contaminates typically includes at least an oxide of Ga and/or an oxide of As. The semiconductor material 104 includes an untreated surface at this point of the present invention which, if used without cleaning and passivation, would result in a structure that is pinned and has a high interface state density (on the order of about $10^{13}$ cm$^{-2}$ eV$^{-1}$ or greater).

Figure 2:
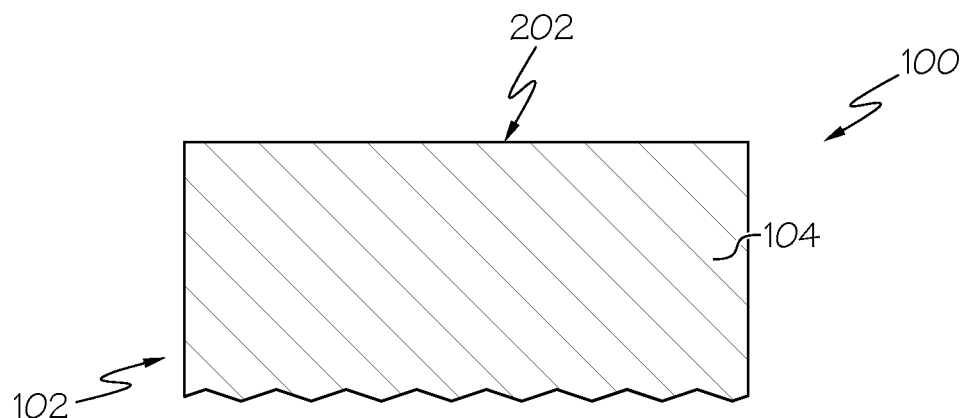
FIG. 2 is a cross-sectional view of the semiconductor structure after native oxide has been removed from the substrate according to one embodiment of the present invention.

The surface of the oxide region is often contaminated by organic compounds during sample handing process under non-vacuum conditions. Therefore, in one embodiment, a sequential cleaning process is performing using, for example, acetone, methanol, and isopropyl alcohol (IPA). This process removes organic contaminants from the surface of the oxide region 106. The native oxide region 106 is then removed exposing a top surface 202 of the semiconductor material 104, as shown in FIG. 2. In one or more embodiments, an ammonium hydroxide (NH$_4$OH) solution is used to remove the surface oxide region 106 of the semiconductor material 104. For example, the oxide region 106 is contacted with a NH4OH solution. The NH$_4$OH may be diluted in water, such as de-ionized water, to produce a solution having a desired concentration of NH$_4$OH such as NH$_4$OH:H$_2$O (1:1). The native oxide region 106 is contacted with the NH$_4$OH solution at room temperature (e.g., 20-25° C.) for two (2) minutes. In one embodiment, the oxide etch time is be 20 seconds or grater. In other embodiments, hydrochloric acid (HCl), hydrofluoric acid (HF), and/or the like are used to remove the native oxide region 106 form the semiconductor material 104. For HCl or HF, a 10% diluted solution in water may be used. At room temp, oxide etch time may be 20 seconds or grater. However, other dilutions and etch times are applicable as well. The removal of the native oxide region 106 creates a treated top surface 202 of the semiconductor material 104.

Figure 3:
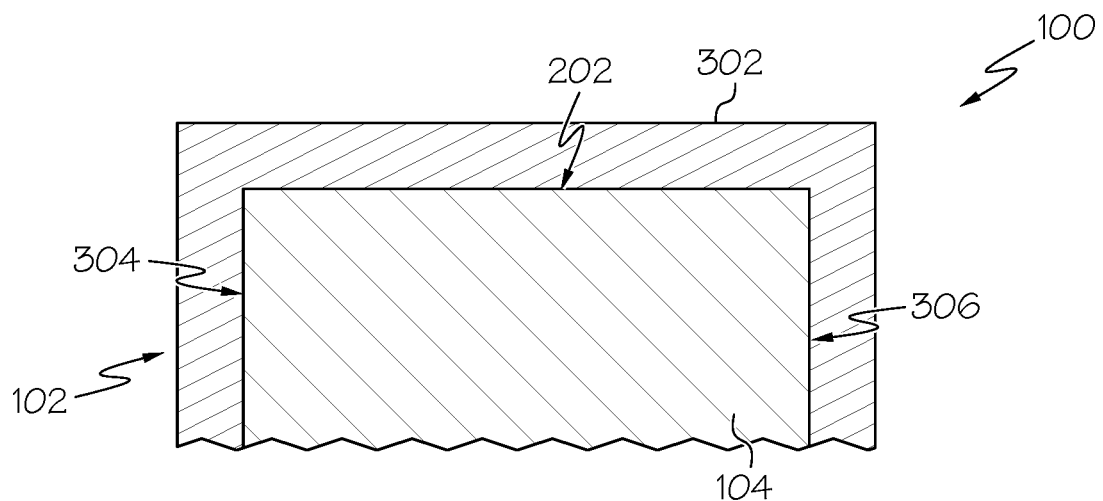
FIG. 3 is a cross-sectional view of the semiconductor structure after a passivation layer has been formed according to one embodiment of the present invention.
Figure 4:
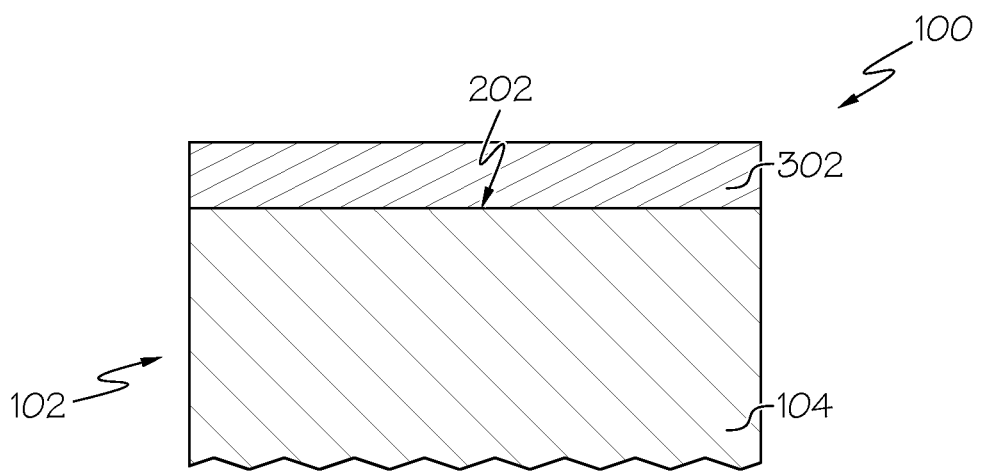
FIG. 4 is a cross-sectional view of the semiconductor structure after an optional process has been performed to remove the passivation layer from the sidewalls of the substrate according to one embodiment of the present invention.
Figure 5:
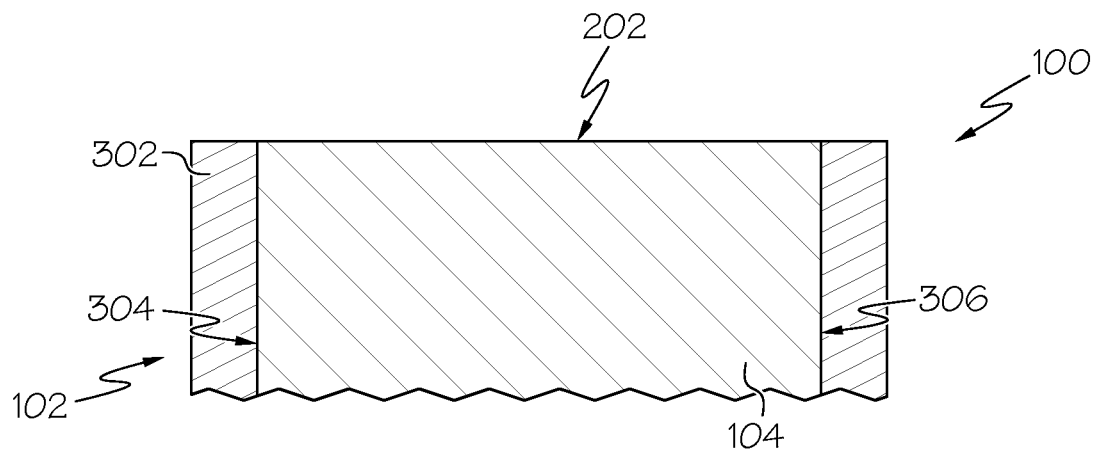
FIG. 5 is a cross-sectional view of the semiconductor structure after an optional process has been performed to remove the passivation layer from the top surface of the substrate according to one embodiment of the present invention.

A passivation layer 302 is then formed on and in contact with the treated surface 202 of the semiconductor material 104 and sidewalls 304, 306 of the semiconductor material 104, as shown in FIG. 3. In one embodiment, a monolayer of sulfur is formed on the treated surface 202 with a thickness of 0.4 nm. However, other thicknesses are applicable as well. In one embodiment, the passivation layer 302 is formed utilizing sulfur passivation by thiourea, where the thiourea has the following formula: SC(NH$_2$)$_2$. For example, the substrate 102 is submersed in an aqueous solution comprising thiourea and ammonium hydroxide NH$_4$OH at room temperature (e.g., 20-25° C.) to 90° C. for two (2) minutes to ten (10) minutes (or greater). However, other temperature and time ranges are applicable as well. It is noted that higher operating temperatures accelerate the passivation reaction. In one embodiment, solution comprises the following concentrations: Thiourea(1.5M):NH$_4$OH:H$_2$O (1:2:4). It should be noted that other base solutions may be utilized instead of ammonium hydroxide. The ammonium hydroxide releases sulfur from the thiourea, which bonds to the surface 202 of the semiconductor material 104 thereby creating the passivation layer 302. After the passivation process, the substrate 102 is rinsed. In one or more embodiments, the passivation layer 302 is removed from the sidewalls 304, 306 using, for example, an acid etch. This process leaves the passivation layer 302 on the top surface 202 of the semiconductor material 104, as shown in FIG. 4. In other embodiments, the passivation layer 302 is removed from the top surface 202 using, for example, an acid etch or a planarization process. This process leaves the passivation layer 302 on the sidewalls 304, 306 of the semiconductor material 104, as shown in FIG. 5.

Figure 6:
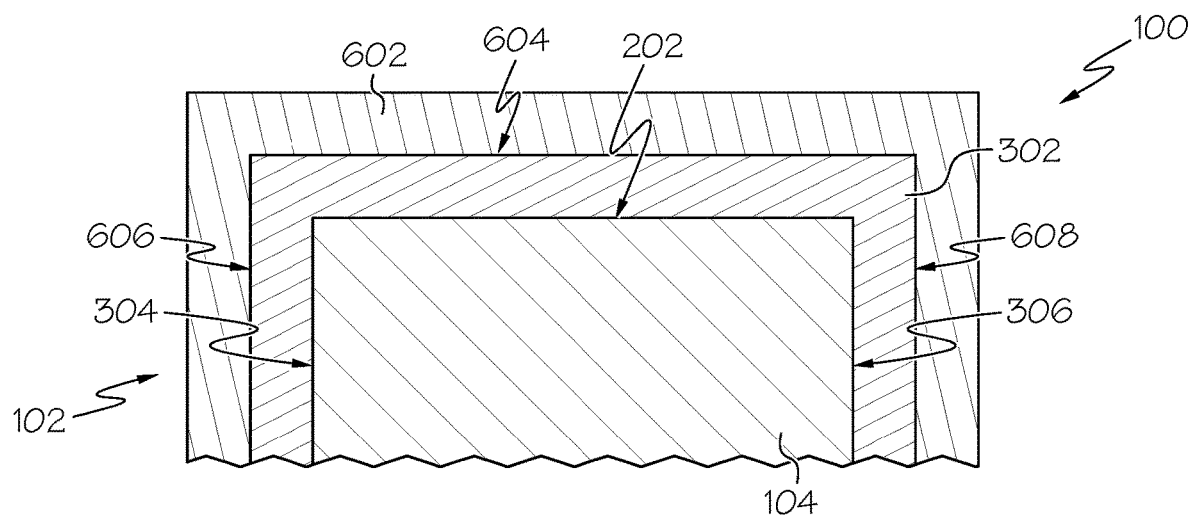
FIG. 6 is a cross-sectional view of the semiconductor structure after a capping layer has been formed according to one embodiment of the present invention.
Figure 7:
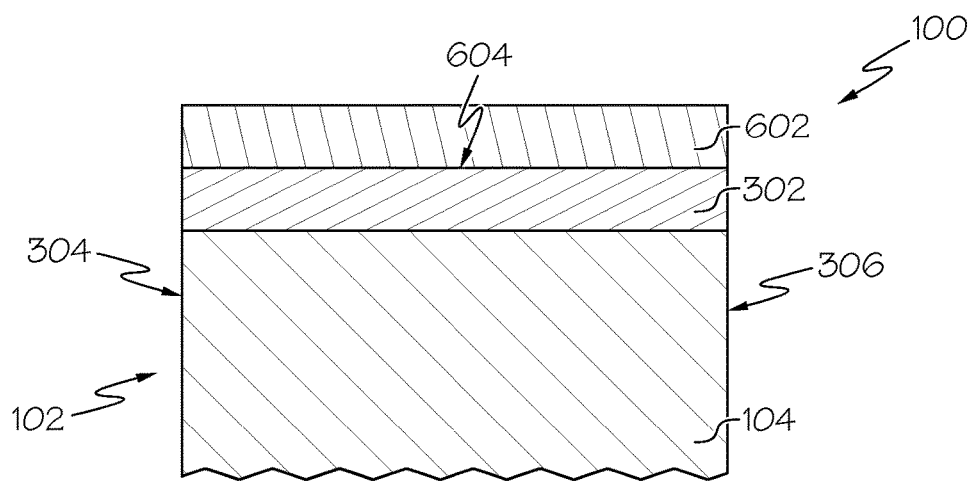
FIG. 7 is a cross-sectional view of the semiconductor structure after an optional process has been performed to remove the capping layer from the sidewalls of the substrate and passivation layer according to one embodiment of the present invention.
Figure 8:
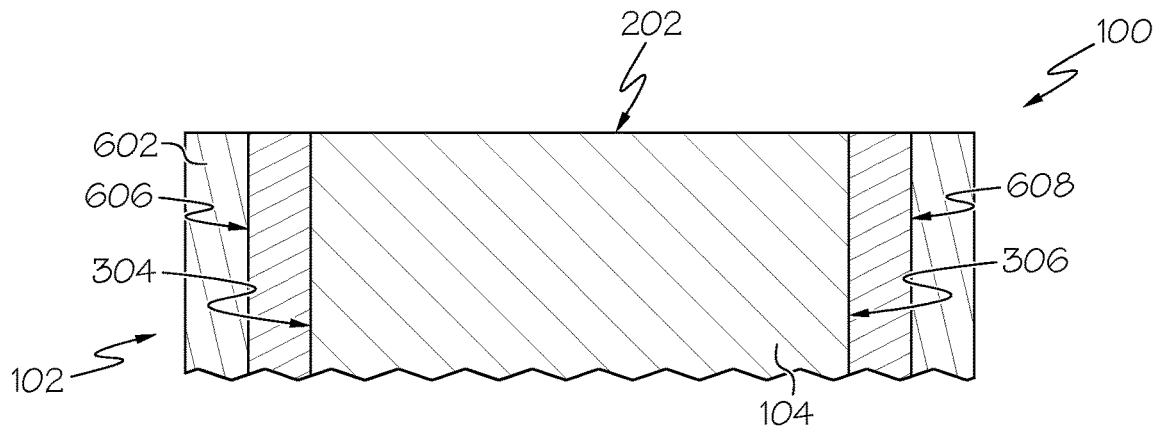
FIG. 8 is a cross-sectional view of the semiconductor structure after an optional process has been performed to remove the passivation layer from the top surface of the passivation layer according to one embodiment of the present invention.

An optional capping/dielectric layer 602 is then formed on and in contact with the structure 100, as shown in FIGS. 6 to 8. In one embodiment, the capping layer 602 comprises a thickness of 2 nm to 20 nm. However, other thicknesses are applicable as well. The capping layer 602 prevents degradation of the passivation layer 302 during subsequent processing steps and further reduces the defect density of the semiconductor material 104. In one embodiment, the capping layer 602 comprises Aluminum Oxide (Al$_2$O$_3$), titanium oxide (TiO$_2$), gallium oxide (Ga$_2$O$_3$), gadolinium oxide (Gd$_2$O$_3$) or Hafnium Oxide (HfO$_2$). Deposition of the capping layer 602 may be performed by various deposition techniques including, but not limited to, atomic layer deposition (ALD), chemical vapor deposition (CVD), physical vapor deposition (PVD), molecular beam deposition (MBD), pulsed laser deposition (PLD), or liquid source misted chemical deposition (LSMCD).

FIG. 6 shows that in an embodiment where the passivation layer 302 contacts the top surface 202 and sidewalls 304, 406 of the semiconductor material 104, the capping layer 602 is formed on and in contact with a top surface 604 and sidewalls 606, 608 of the passivation layer 302. FIG. 7 shows that in an embodiment where the passivation layer 302 has been removed from the sidewalls 304, 306 of the semiconductor material 104, an etching process is used to remove the capping layer 602 from the sidewalls 304, 306 of the semiconductor material 104. In this embodiment, the capping layer 602 remains in contact with top surface 604 of the passivation layer 302. FIG. 8 shows that in an embodiment, where the passivation layer 302 has been removed from the top surface 202 of the semiconductor material 104 but remains in contact sidewalls 304, 306 of the semiconductor material 104, an etching or planarization process is used to remove the capping layer 602 from the top surface 202 of the passivation layer 302. In this embodiment, the capping layer 602 remains in contact with the sidewalls 606, 608 of the passivation layer 602.

An optional annealing process may then be performed to anneal the capping layer 602. In one embodiment, the annealing process is a forming gas (e.g., a mixture of hydrogen (5%) and nitrogen) anneal performed at a temperature ranging from 200° C. to 400° C. In one embodiment, a tube furnace with a constant gas flow rate of ~5 sccm under atmosphere pressure is utilized. However, other annealing processes and temperatures are applicable as well. The annealing processing further passivates defects at the interface and the capping layer 602 since the hydrogen in the forming gas binds with the defects.

Subsequent fabrication processes are then performed to form one or more semiconductor devices using the semiconductor structure 100 discussed above. For example, optoelectronic devices such as lasers, light emitting diodes, and photovoltaic devices may be fabricated using the using the semiconductor structure 100 as a substrate. In conventional laser devices, injected electron/hole may recombine at the sidewall surface due to the high defect states (dangling bonds). However, the sidewall passivation of one or more embodiments, allow more photons to be emitted such that high external efficiency is achieved. The large surface area of light emitting diodes benefits from the surface passivation of one or more embodiments, which results in higher light emission efficiency. In conventional photovoltaic devices, photo-generated carrier will drift and diffuse toward two electrode high recombination occurs at the surface due to higher defect density (dangling bonds) at the surface and side wall. However, the surface passivation of one or more embodiments, allows for high short circuit current, larger open-circuit voltage, and overall larger output power.

Figure 9:
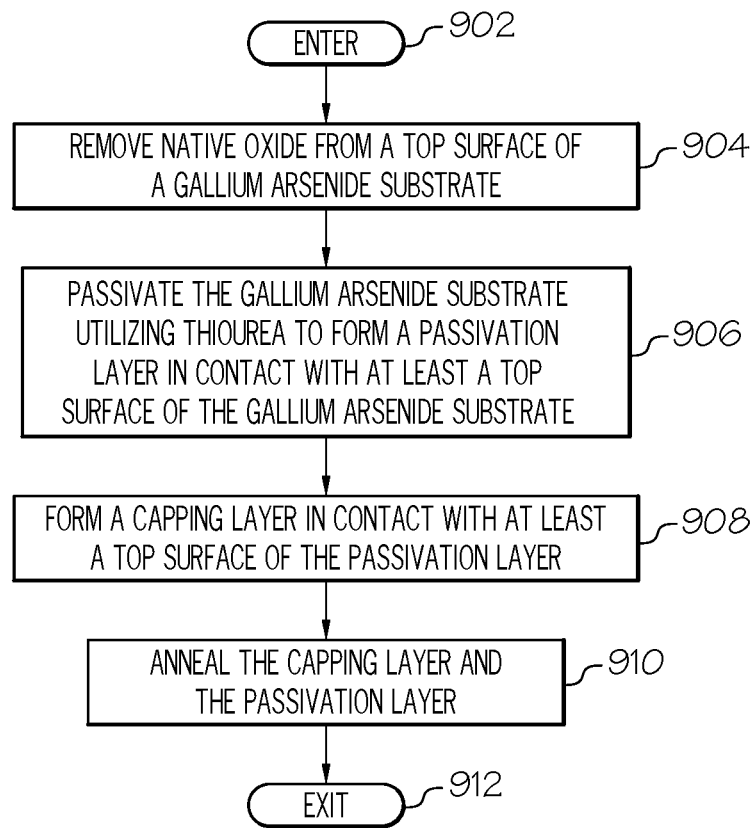
FIG. 9 is an operational flow diagram illustrating one process for fabricating a semiconductor structure comprising a thiourea-passivated surface according to one embodiment of the present invention.

FIG. 9 is an operational flow diagram illustrating one process for fabricating a semiconductor structure comprising a thiourea-passivated surface. In FIG. 9, the operational flow diagram begins at step 902 and flows directly to step 904. It should be noted that each of the steps shown in FIG. 9 have been discussed above with respect to FIGS. 1-8. Native oxide is removed from a top surface a gallium arsenide substrate, at step 904. The gallium arsenide substrate is passivated utilizing thiourea to form a passivation layer in contact with at least a top surface of the gallium arsenide substrate, at step 906. The passivation of the gallium arsenide substrate comprises subjecting the gallium arsenide substrate to a solution comprising thiourea and ammonium hydroxide at a temperature within a range of 20° C. to 90° C. for a given period of time. A capping layer is formed in contact with at least a top surface of the passivation layer, at step 908. The capping layer and the passivation layer are then annealed, at step 910. The control flow then exits at step 912.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for fabricating a semiconductor structure, the method comprising:
   passivating a gallium arsenide substrate utilizing thiourea to form a passivation layer in contact with at least a top surface and outer sidewalls of the gallium arsenide substrate;
   forming a capping layer in contact with a top surface of the passivation layer and sidewalls of the passivation layer;
   etching portions of the passivation layer in contact with the outer sidewalls of the gallium arsenide substrate, and portions of the capping layer in contact with sidewalls of the passivation layer, wherein the etching exposes sidewalls of the gallium arsenide substrate; and
   annealing the capping layer and the passivation layer.

2. The method of claim 1, wherein passivating the gallium arsenide substrate comprises:
   subjecting the gallium arsenide substrate to a solution comprising thiourea and ammonium hydroxide.

3. The method of claim 2, wherein the gallium arsenide substrate is subjected to the solution at a temperature within a range of 20° C. to 90° C. for a given period of time.

4. The method of claim 3, wherein the solution comprises concentrations of Thiourea(1.5M):NH$_4$OH:H$_2$O (1:2:4).

5. The method of claim 1, further comprising:
   removing native oxide from a top surface of the gallium arsenide substrate prior to the passivation being formed.

6. The method of claim 1, wherein forming the capping layer comprises:
   forming one of an aluminum oxide layer or a hafnium oxide layer in contact with at least a top surface of the passivation layer.

\* \* \* \* \*